United States Patent
Chang et al.

(10) Patent No.: US 8,390,343 B2
(45) Date of Patent: Mar. 5, 2013

(54) INJECTION-LOCKED FREQUENCY DIVIDER

(75) Inventors: Hong-Yeh Chang, Taipei County (TW); Yen-Liang Yeh, Taoyuan County (TW); Chia-Hung Chang, Chiayi County (TW); Chun-Jen Chen, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 42 days.

(21) Appl. No.: 12/980,284

(22) Filed: Dec. 28, 2010

(65) Prior Publication Data

US 2012/0019289 A1    Jan. 26, 2012

(30) Foreign Application Priority Data

Jul. 20, 2010 (TW) .............................. 99123841 A

(51) Int. Cl.
*H03B 19/06* (2006.01)
(52) U.S. Cl. ......... 327/118; 327/113; 327/115; 327/117
(58) Field of Classification Search .................. 327/115, 327/117, 118
See application file for complete search history.

(56) References Cited

U.S. PATENT DOCUMENTS

| | | | |
|---|---|---|---|
| 7,522,007 B2 | 4/2009 | Jang et al. | |
| 7,522,008 B2 | 4/2009 | Jang et al. | |
| 7,557,664 B1 | 7/2009 | Wu | |
| 7,557,668 B2 | 7/2009 | Jang et al. | |
| 7,961,058 B2 * | 6/2011 | Luong et al. | 331/74 |
| 2008/0074199 A1 | 3/2008 | Jang et al. | |
| 2008/0197894 A1 * | 8/2008 | Jang et al. | 327/118 |

FOREIGN PATENT DOCUMENTS

CN         101777871        7/2010

OTHER PUBLICATIONS

Tang-Nian Luo et al, "A 0.8-mW 55-GHz Dual-Injection-Locked CMOS Frequency Divider", IEEE Transactions on Microwave Theory and Techniques, vol. 56, No. 3, issued on Mar. 2008, p. 620-p. 625.
Ken Yamamoto et al., "55GHz CMOS frequency divider with 3.2GHz locking range", appears in Solid-State Circuits Conference, 2004. ESSCIRC 2004. Proceeding of the 30th European, issued on Sep. 21-23, 2004, p. 135-p. 138.
Jun-Chau Chien et al., "40GHz Wide-Locking-Range Regenerative Frequency Divider and Low-Phase-Noise Balanced VCO in 0.18 μm CMOS", 2007 IEEE International Solid-State Circuits Conference, issued on Feb. 14, 2007, p. 544-p. 545, p. 621.
"First Office Action of China counterpart application" issued on Dec. 4, 2012, p1-p5.

* cited by examiner

*Primary Examiner* — John Poos
(74) *Attorney, Agent, or Firm* — Jianq Chyun IP Office

(57) ABSTRACT

An injection-locked frequency divider is provided and which includes an injection transistor, an oscillator, a current source and a transformer. The injection transistor is used to receive an injection signal. The oscillator is used to divide the injection signal to generate a divided frequency signal. The current source is coupled to the oscillator to provide a current to the oscillator. The transformer is coupled between the injection transistor and the oscillator to increase the equivalent transconductance of the injection transistor, and thus increasing the locking range of the injection-locked frequency divider.

10 Claims, 2 Drawing Sheets

US 8,390,343 B2

INJECTION-LOCKED FREQUENCY DIVIDER

CROSS-REFERENCE TO RELATED APPLICATION

This application claims the priority benefit of Taiwan application serial no. 99123841, filed on Jul. 20, 2010. The entirety of the above-mentioned patent application is hereby incorporated by reference herein and made a part of this specification.

TECHNICAL FIELD

The disclosure relates to a frequency divider, and more particular to, an injection-locked frequency divider.

BACKGROUND

Frequency dividers play an important role in phase-locked loops (PLLs) and are also a key circuit in wireless communication systems. There are generally three types of frequency dividers, including current mode logic (CML) frequency dividers, injection-locked frequency dividers, and regenerative frequency dividers.

In general, the CML frequency divider has good sensitivity and bandwidth. However, limited by its component's cut-off frequency (ft), the CML frequency divider generally has a low operating frequency. Although the operating frequency of the regenerative frequency divider is higher than that of the CML frequency divider, the regenerative frequency divider has high direct current power consumption. The injection-locked frequency divider has low power consumption as well as high operating frequency, but the locking range thereof is usually narrow. Therefore, the injection frequency dividers have limited use in current wireless communication systems which call for high data amount transmission, low voltage and low power consumption.

SUMMARY

In light of the above, the disclosure provides an injection-locked frequency divider which includes an injection transistor, an oscillator, a current source and a transformer. The injection transistor is adapted for receiving an injection signal. The oscillator is adapted for dividing the injection signal to generate a divided frequency signal. The current source is coupled to the oscillator and adapted for providing a current to the oscillator. The transformer is coupled between the injection transistor and the oscillator and adapted for increasing the equivalent transconductance of the injection transistor.

The disclosure also provides an injection-locked frequency divider which includes an injection transistor, an oscillator, a current source and a transformer. The injection transistor is adapted for receiving an injection signal. The oscillator is adapted for dividing the injection signal to generate a divided frequency signal. The current source is coupled to the oscillator and adapted for providing a current to the oscillator. The transformer is coupled between the injection transistor and the oscillator and adapted for increasing the equivalent transconductance of the injection transistor. The transformer includes a primary coil, a first secondary coil and a second secondary coil. A gate of the injection transistor is adapted for receiving the injection signal through the primary coil. The oscillator is coupled to a drain and a source of the injection transistor through the first secondary coil and the second secondary coil. In addition, the coupling between the primary coil and the first secondary coil as well as the coupling between the primary coil and the second secondary coil comprises the positive coupling.

It should be known that the general description above and the embodiments below are only exemplary and for descriptive purposes, and do not limit the scope of the claims.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
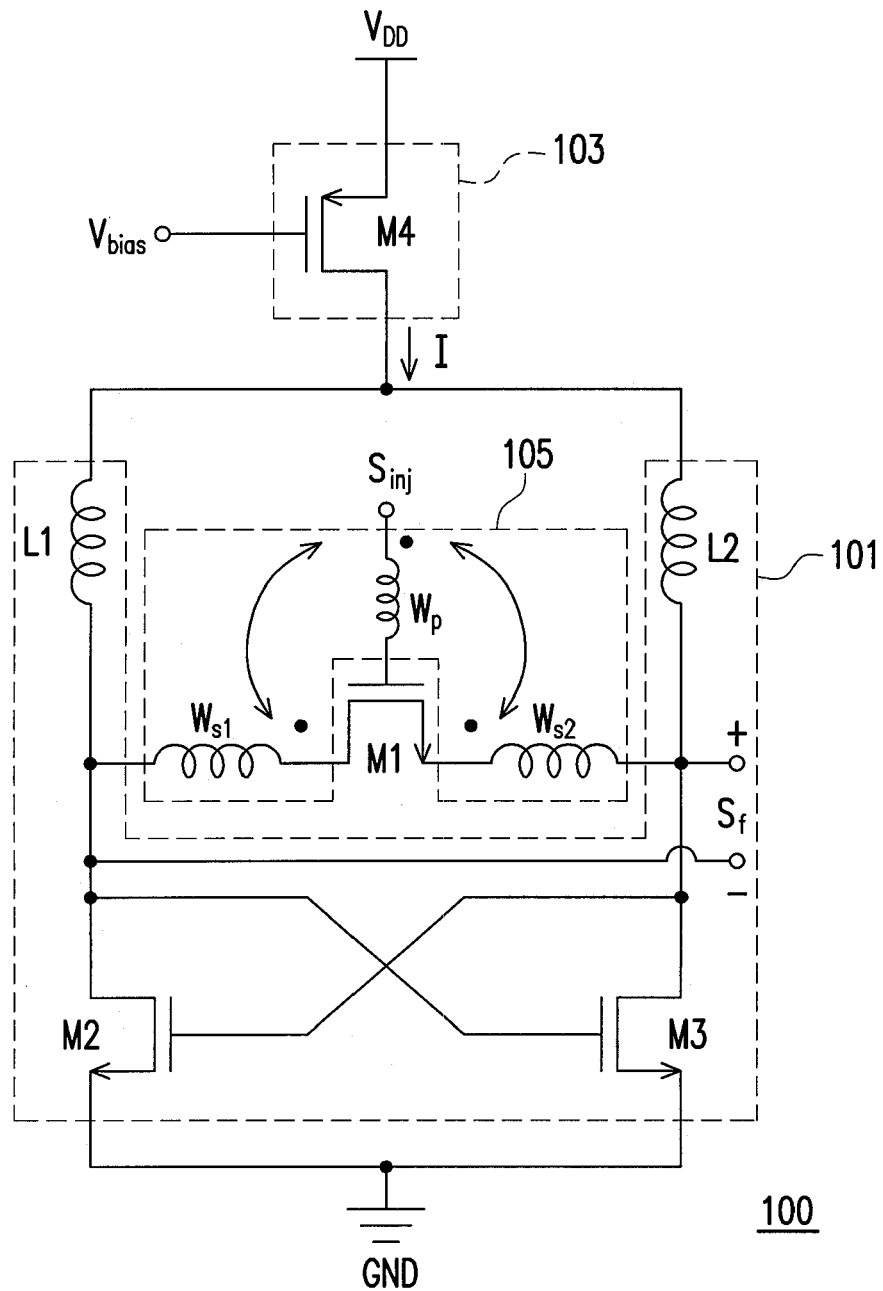
FIG. 1 is a schematic diagram illustrating a circuit of an injection-locked frequency divider according to an exemplary embodiment.

The following refers to the exemplary embodiments in detail and illustrates implementations of the exemplary embodiments in the accompanying drawings. In addition, whenever possible, the same reference numerals in the figures and embodiments represent the same or similar elements.

FIG. 1 is a schematic diagram of a circuit of an injection-locked frequency divider 100 according to one exemplary embodiment. Referring to FIG. 1, the injection-locked frequency divider 100 includes an injection transistor M1, an oscillator 101, a current source 103, and a transformer 105. In this exemplary embodiment, the injection transistor M1 is used to receive an injection signal $S_{inj}$. The oscillator 101 is used to divide the injection signal $S_{inj}$ to generate a divided frequency signal $S_f$. The frequency of the injection signal $S_{inj}$ is substantially two times of the frequency of the divided frequency signal $S_f$.

The current source 103 is coupled to the oscillator 101 and adapted for providing a stable current I to the oscillator 101. The transformer 105 is coupled between the injection transistor M1 and the oscillator 101, and adapted for increasing the equivalent transconductance of the injection transistor M1, thereby increasing the locking range of the injection-locked frequency divider 100.

To be specific, the transformer 105 includes a primary coil $W_p$ and two secondary coils $W_{s1}$ and $W_{s2}$. A gate of the injection transistor M1 receives the injection signal $S_{inj}$ via the primary coil $W_p$. In this exemplary embodiment, the coupling between the primary coil $W_p$ and the secondary coil $W_{s1}$ is positive coupling, i.e. the primary coil $W_p$ and the secondary coil $W_{s1}$ have the same polarities (more specifically, the current flows into the primary coil $W_p$ via a dot coil end thereof, and the current flows out of the secondary coil $W_{s1}$ via a dot coil end thereof). In addition, the coupling between the primary coil $W_p$ and the secondary coil $W_{s2}$ is also positive coupling, i.e. the primary coil $W_p$ and the secondary coil $W_{s2}$ have the same polarities (more specifically, the current flows into the primary coil $W_p$ via the dot coil end thereof, and the current flows out of the secondary coil $W_{s2}$ via a dot coil end thereof). The reason of the positive coupling between the primary coil $W_p$ and the secondary coil $W_{s1}$, and the positive coupling between the primary coil $W_p$ and the second coil $W_{s2}$ is further described below in detail. Moreover, the equivalent inductances (i.e. $L_p$, $L_{s2}$) of all of the coils $W_p$, $W_{s1}$ and $W_{s2}$ may be a multiple of each other.

The oscillator 101 includes inductors L1 and L2, and transistors M2 and M3. In this exemplary embodiment, the inductors L1 and L2 and parasitic capacitances of the transistors M2 and M3 would cause the oscillator 101 to be an LC oscillator. A first terminal of the inductor L1 is coupled to a drain of the injection transistor M1 through the secondary coil $W_{s1}$, and a second terminal of the inductor L1 is coupled to the current source 103 to receive the stable current I. Similarly, a first terminal of the inductor L2 is coupled to a source of the injection transistor M1 through the secondary coil $W_{s2}$, and a second terminal of the inductor L2 is coupled to the current source 103 to receive the stable current I. In this exemplary embodiment, the first terminals of the inductors L1 and L2 are used to transmit the divided frequency signal $S_f$.

A gate of the transistor M2 is coupled to the first terminal of the inductor L2. A drain of the transistor M2 is coupled to the first terminal of the inductor L1. A source of the transistor M2 is coupled to the ground GND. A gate of the transistor M3 is coupled to the first terminal of the inductor L1. A drain of the transistor M3 is coupled to the first terminal of the inductor L2. A source of the transistor M3 is coupled to the ground GND. In this exemplary embodiment, the transistors M2 and M3 provide a negative resistance to compensate for the loss of the resonator in the oscillator 101 through a cross-couple configuration. Herein, the negative resistance provided by the transistors M2 and M3 is to cancel out the parasitic resistances of the resonator of the oscillator 101 thus enabling the oscillator 101 to maintain stable oscillation.

The current source 103 includes a transistor M4. A gate of the transistor M4 is biased a voltage $V_{bias}$. A source of the transistor M4 is connected to a DC supply voltage $V_{DD}$. A drain of the transistor M4 is coupled to the second terminals of the inductors L1 and L2 to thereby output the stable current I to the oscillator 101. It is noted that each of transistors M1-M3 is an N-type transistor (for example, but not limited thereto, an NMOS transistor), while the transistor M4 is a P-type transistor (for example, but not limited thereto, a PMOS transistor).

Accordingly, in generating the divided frequency signal $S_f$, the injection-locked frequency divider 100 receives, through the primary coil $W_p$, the injection signal $S_{inj}$ so as to transmit it to the gate of the injection transistor M1. Herein, the frequency of the injection signal $S_{inj}$ is denoted as $F_{inj}$. Once the oscillating frequency of the oscillator 101 approaches 0.5 times of the frequency $F_{inj}$, the injection-locked frequency divider 100 enters into a locking state and delivers a divided frequency signal $S_f$ via the first terminals of the inductors L1 and L2.

In general, the injection locking range of the injection-locked frequency divider is dependent upon its loop gain. Therefore, if the loop gain of the injection-locked frequency divider 100 can be effectively increased, the locking range of the injection-locked frequency divider 100 can be increased. In order to increase the loop gain of the injection-locked frequency divider 100, a transconductance-increase technique is employed in this exemplary embodiment to achieve a wider locking range of the injection-locked frequency divider 100.

Herein, if the injection locking range of the injection-locked frequency divider 100 is denoted by A, then the injection locking range of the injection-locked frequency divider 100 can be expressed as:

$$A = 2\omega_0^2 L g_m$$

where, $\omega_0$ is the oscillating angular frequency (rad/s), L stands for the equivalent inductance in the resonator of the oscillator 101, and $g_m$ stands for the equivalent transconductance of the injection transistor M1.

From the above equation, it can be seen that the injection locking range can be enhanced by increasing the inductance L or transconductance $g_m$. However, as a primary factor for determining the oscillating frequency of the oscillator 101, the inductor L cannot be an arbitrary value. Accordingly, the exemplary embodiment employs the trans conductance-boost technique to increase the equivalent transconductance of the injection-locked transistor M1 to thereby widen/increase the locking range of the injection-locked frequency divider 100. In other words, increasing the equivalent transconductance can make the injection-locked frequency divider 100 have a wider injection locking range.

Figure 2A:
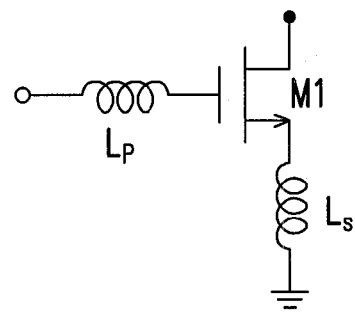
FIG. 2A to FIG. 2C are respectively a schematic diagram illustrating a circuit topology of a small signal model of the injection transistor and the primary and secondary coils of the transformer.
Figure 2B:
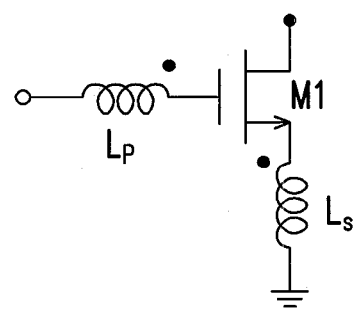
Figure 2C:
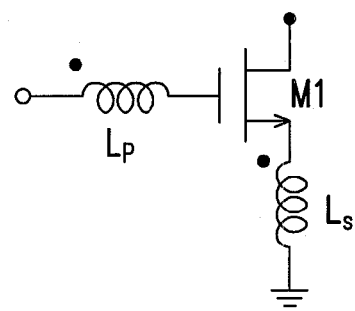

Accordingly, circuit design and system simulation software (e.g. Agilent ADS) is utilized in this exemplary embodiment to simulate small signal models of three circuit topologies shown in FIGS. 2A to 2C to thereby derive the equivalent transconductance $g_m$ of said three circuit topologies respectively.

As shown in FIGS. 2A to 2C, $L_p$ denotes the equivalent inductance of the primary coil $W_p$, and $L_s$ denotes the equivalent inductance of the secondary coils $W_{s1}/W_{s2}$ (i.e. $L_{s1}/L_{s2}$).

The circuit topology shown in FIG. 2A does not consider the polarities of the primary coil $W_p$ and the secondary coils $W_s$. From the simulation of the circuit topology of FIG. 2A using AGILENT ADS software, it can be deduced that the equivalent transconductance $g_m$ of the injection transistor M1 does not change.

In the circuit topology shown in FIG. 2B, the primary coil $W_p$ and the secondary coils $W_{s1}/W_{s2}$ have opposite polarities, i.e. the coupling between the primary coil $W_p$ and the secondary coils $W_{s1}/W_{s2}$ is the negative coupling. From the simulation of the circuit topology of FIG. 2B using AGILENT ADS software, it can be deduced that the equivalent transconductance $g_m$ of the injection transistor M1 decreases by (1−k/n) times, i.e. to $g_m*(1-k/n)$, where k is the coupling factor of the transformer 105 and n is equal to $\sqrt{Ls/Lp}$.

In the circuit topology shown in FIG. 2C, the primary coil $W_p$ and the secondary coils $W_{s1}/W_{s2}$ have the same polarities, i.e. the coupling between the primary coil $W_p$ and the secondary coils $W_{s1}/W_{s2}$ is the positive coupling. From the simulation of the circuit topology of FIG. 2C using AGILENT ADS software, it can be deduced that the equivalent transconductance $g_m$ of the injection transistor M1 increases by k/n times, i.e. to $g_m*(1+k/n)$.

It can thus be seen that the same polarities of the primary coil $W_p$ and the secondary coils $W_{s1}/W_{s2}$ can effectively increase the equivalent transconductance of the injection transistor M1. For this reason, the coupling between the primary coil $W_p$ and the secondary coils $W_{s1}/W_{s2}$ is configured to be positive coupling in this exemplary embodiment.

With the effective increase of the transconductance of the transistor M1, the injection locking range of the injection-locked frequency divider 100 can also be effectively increased based on the above equation (i.e. $A = 2\omega_0^2 L g_m$). It is noted that, if the circuit simulations are conducted with respect to the injection-locked frequency divider 100 with the transformer 105 and the injection-locked frequency divider 100 with the transformer 105 removed, respectively, it will then be clear that the injection locking range of the injection-locked frequency divider 100 with the transformer 105 is about 30% more or may be even wider than the injection locking range of the injection-locked frequency divided 100 with the transformer 105 removed.

In summary, the injection-locked frequency divider provided by this disclosure can achieve a wider injection locking range by employing the transconductance-boost technique without consuming additional direct current power. Therefore, the injection-locked frequency divider provided by this disclosure can be advantageously used in wireless communication systems, especially in transceiver modules of wireless communication mobile devices. In addition, with its wide frequency, the injection-locked frequency divider provided by this disclosure can also be used to meet frequency requirements of other different system specifications, i.e. automotive radar system, microwave and millimeter-wave circuit systems. Moreover, the injection-locked frequency divider provided by this disclosure may be realized by using a low cost silicon process, and thus increasing its practicality.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An injection-locked frequency divider, comprising:
   an injection transistor adapted for receiving an injection signal;
   an oscillator adapted for dividing the injection signal to generate a divided frequency signal;
   a current source coupled to the oscillator and adapted for providing a current to the oscillator; and
   a transformer coupled between the injection transistor and the oscillator and adapted for increasing an equivalent transconductance of the injection transistor.

2. The injection-locked frequency divider according claim 1, wherein the transformer includes a primary coil, a first secondary coil and a second secondary coil, and a gate of the injection transistor is adapted for receiving the injection signal via the primary coil.

3. The injection-locked frequency divider according claim 2, wherein the oscillator comprises:
   a first inductor having a first terminal coupled to a drain of the injection transistor through the first secondary coil and a second terminal coupled to the current source to receive the current;
   a second inductor having a first terminal coupled to a source of the injection transistor through the second secondary coil, and a second terminal coupled to the current source to receive the current, wherein the first terminals of the first inductor and the second inductor are adapted for transmitting the divided frequency signal;
   a first transistor having a gate coupled to the first terminal of the second inductor, a drain coupled to the first terminal of the first inductor, and a source coupled to ground; and
   a second transistor having a gate coupled to the first terminal of the first inductor, a drain coupled to the first terminal of the second inductor, and a source coupled to the ground.

4. The injection-locked frequency divider according claim 3, wherein the current source comprises a third transistor, and the third transistor has a gate adapted for receiving a bias voltage, a source adapted for receiving a DC supply voltage, and a drain coupled to the second terminals of the first inductor and the second inductor.

5. The injection-locked frequency divider according claim 4, wherein the injection transistor, the first transistor and the second transistor are NMOS transistors, and the third transistor is a PMOS transistor.

6. The injection-locked frequency divider according claim 2, wherein a coupling between the primary coil and the first secondary coil comprises a positive coupling which indicates that the primary coil and the first secondary coil have the same polarities.

7. The injection-locked frequency divider according claim 2, wherein a coupling between the primary coil and the second secondary coil comprises a positive coupling which indicates that the primary coil and the second secondary coil have the same polarities.

8. The injection-locked frequency divider according claim 1, wherein a frequency of the injection signal is two times of a frequency of the divided frequency signal.

9. An injection-locked frequency divider, comprising:
   an injection transistor adapted for receiving an injection signal;
   an oscillator adapted for dividing the injection signal to generate a divided frequency signal;
   a current source coupled to the oscillator and adapted for providing a current to the oscillator; and
   a transformer coupled between the injection transistor and the oscillator and adapted for increasing an equivalent transconductance of the injection transistor;
   wherein the transformer comprises a primary coil, a first secondary coil and a second secondary coil, a gate of the injection transistor is adapted for receiving the injection signal through the primary coil, and the oscillator is coupled to a drain and a source of the injection transistor through the first secondary coil and the second secondary coil, and
   wherein a coupling between the primary coil and the first secondary coil comprises a positive coupling, and a coupling between the primary coil and the second secondary coil comprises a positive coupling.

10. The injection-locked frequency divider according to claim 9, wherein a frequency of the injection signal is two times of a frequency of the divided frequency signal, the positive coupling between the primary coil and the first secondary coil indicates that the primary coil and the first secondary coil have the same polarities, and the positive coupling between the primary coil and the second secondary coil indicates that the primary coil and the second secondary coil have the same polarities.

* * * * *